US012800614B1

(12) United States Patent
Dadoosh et al.

(10) Patent No.: US 12,800,614 B1
(45) Date of Patent: Nov. 17, 2026

(54) HIGH-THROUGHPUT TEST SYSTEM AND METHOD OF TESTING

(71) Applicant: InZiv Ltd., Jerusalem (IL)

(72) Inventors: Ori Dadoosh, Raanana (IL); Doobie Abraham, Haifa (IL); Yaakov Davidi, Nof Aylon (IL); Yuval Yohai, Rehovot (IL); Yuri Levinzon, Tel Aviv (IL)

(73) Assignee: InZiv Ltd., Jerusalem (IL)

( * ) Notice: Subject to any disclaimer, the term of this patent is extended or adjusted under 35 U.S.C. 154(b) by 0 days.

(21) Appl. No.: 19/334,124

(22) Filed: Sep. 19, 2025

(51) Int. Cl.
*G01R 1/07* (2006.01)
*G01R 1/04* (2006.01)
*G01R 1/073* (2006.01)

(52) U.S. Cl.
CPC ....... *G01R 1/07342* (2013.01); *G01R 1/0466* (2013.01)

(58) Field of Classification Search
CPC .......................... G01R 1/07342; G01R 1/0466
See application file for complete search history.

(56) References Cited

U.S. PATENT DOCUMENTS 5,444,386 A * 8/1995 Mizumura ......... G01R 1/07314 324/756.04
6,127,831 A * 10/2000 Khoury .................... G01R 3/00 324/755.09
8,823,406 B2 * 9/2014 Bolt ...................... G01J 1/0242 356/73
11,604,212 B1 * 3/2023 Pichumani ......... G01R 1/07342
2009/0009200 A1 * 1/2009 Nielsen .................... G01R 3/00 438/689
2010/0134134 A1 * 6/2010 Grover ............... G01R 31/2889 324/750.3
2013/0269173 A1 * 10/2013 Albertson ................ G01R 3/00 29/729
2014/0091828 A1 * 4/2014 Shia .................. G01R 1/06705 324/759.01
2015/0168454 A1 * 6/2015 Ku ..................... G01R 1/06772 324/750.24
2020/0379015 A1 * 12/2020 Subranni .................. G01R 3/00
2022/0206042 A1 * 6/2022 Kobayashi ......... G01R 1/06727
2024/0183895 A1 * 6/2024 Lee .................... G01R 1/07314
2025/0123319 A1 * 4/2025 Parrish ............... G01R 31/2635
2025/0130253 A1 * 4/2025 Lou .................... G01R 1/07342
2025/0258219 A1 * 8/2025 Lewinnek .......... G01R 1/07342

* cited by examiner

*Primary Examiner* — Eman A Alkafawi
*Assistant Examiner* — Suresh K Rajaputra
(74) *Attorney, Agent, or Firm* — Sterne, Kessler, Goldstein & Fox P.L.L.C.

(57) ABSTRACT

A system and a method of testing semiconductor devices are disclosed. The system includes a replacement station, a metrology station, and a probe card manipulator. The replacement station includes a probe card holder configured to hold a plurality of probe cards and a robotic arm configured to remove a probe card from the plurality of probe cards out of the replacement station. The metrology station includes a probe card receptacle configured to hold the probe card removed from the replacement station. The probe card manipulator is configured to transport the probe card from the robot arm to the metrology station. The method includes removing a probe card from the probe card holder, attaching the probe card to the probe card receptacle to form a probe card assembly, and testing a plurality of devices of a device under test (DUT) using the probe card assembly.

24 Claims, 15 Drawing Sheets

HIGH-THROUGHPUT TEST SYSTEM AND METHOD OF TESTING

BACKGROUND

Devices, such as electronic, optoelectronic, electromechanical and other types of devices can be inspected and/or tested during or after fabrication, and/or assembly. Testing is particularly important for eliminating defective and non-conforming devices early in the manufacturing process, which ultimately improves the quality of end-products and reduces costly customer returns. An example testing modality is electrical excitation of a device, which imposes a voltage or current to a probe that is in electrical communication with the device. Typically, in this example, the device and the probe are part of the same circuit, and the imposition of the current/voltage is to drive excitation of the device to produce a variety of signals, such as emission values. These can then be monitored or sensed optically and/or electrically and recorded for analysis. A device subjected to such testing can be referred to as a device under test (DUT). High-throughput and high yield testing of a DUT is desirable because both throughput and yield have a direct impact on device cost. Such high-throughput and high yield testing requires a high degree of testing automation, minimization of test equipment downtime, and minimization of damage to both DUT and probe, which current test systems are unable to adequately achieve.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1:
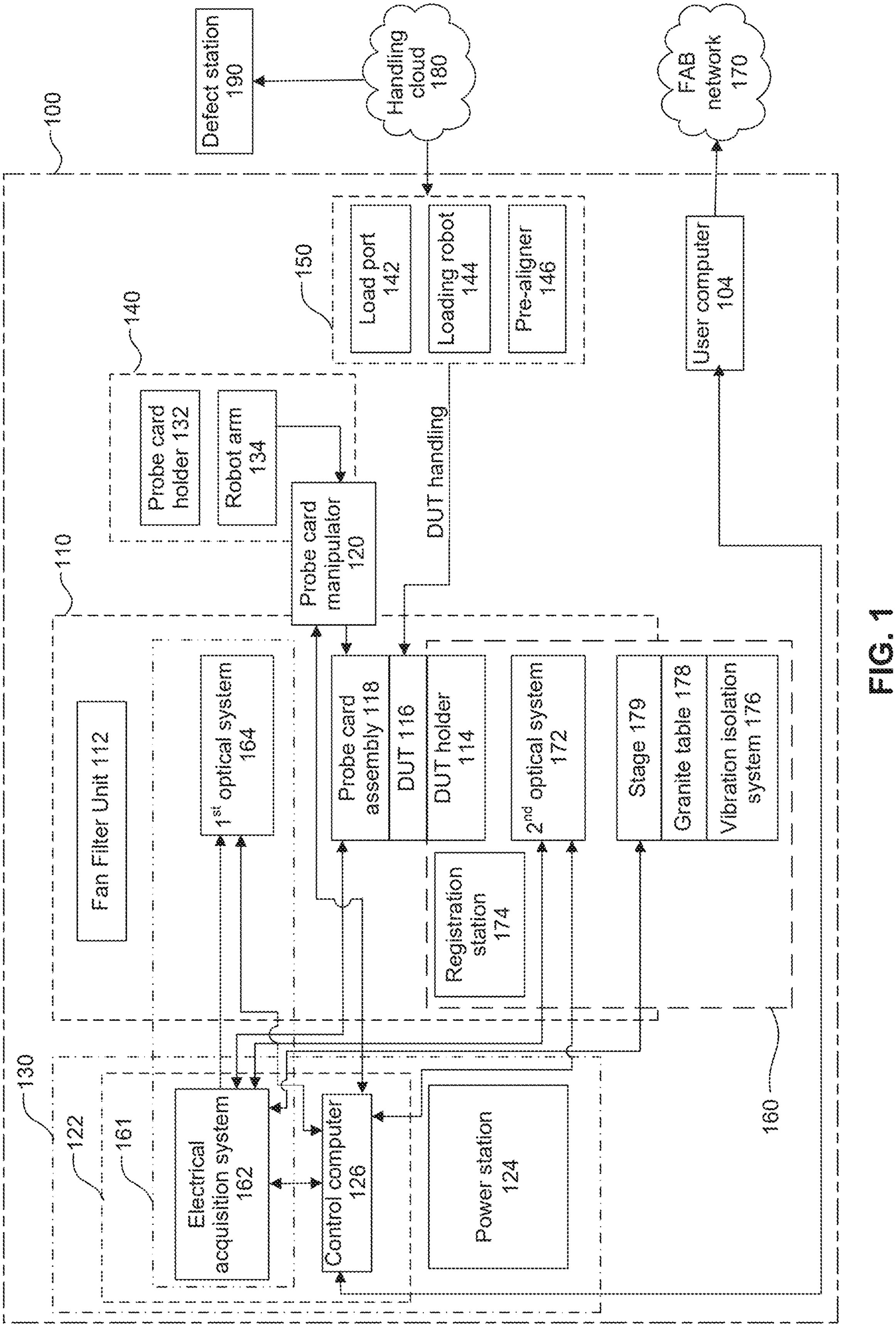
FIG. 1 illustrates a block diagram of a test system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5-20% of the value (e.g., ±5%, ±10%, ±10-15%, ±15~20% of the value). These values are merely examples and are not intended to be limiting. The terms "about" and "substantially" can refer to a percentage of the values as interpreted by those skilled in relevant art(s) in light of the teachings herein.

Semiconductor devices, such as electronic, optoelectronic, electromechanical and other types of devices can be formed in a one or two-dimensional array on a wafer or other surfaces for evaluation to ensure their functionality, performance, and/or compliance with specifications. Such a platform containing devices for evaluation can be referred to as a device under test (DUT). Evaluation methods can include testing each of the devices in an array in parallel (i.e., simultaneously) by applying parallel (i.e., simultaneous) electrical, electrochemical, optical, and/or other such excitations to the devices in the array. These parallel excitations can produce a variety of signals, such as emission values from the devices, which can be detected and/or sensed in parallel (i.e., simultaneously). Such parallel and high-throughput testing of semiconductor devices in consumer electronics can be beneficial, as a DUT in consumer electronics can have millions of individual devices for testing.

Detecting defects as early as possible in the device fabrication process can prevent costly yield losses at higher assembly levels, and a high test throughput can further enable substantial product cost reductions.

Some test methods can utilize replaceable, two-dimensional test probe arrays in a probe card customized to each DUT, but such test probe arrays can be limited in use. Also, the stiff probes in some test probe arrays can leave "scrub marks" on each device test pad of the DUT, damaging both the device test pads and the probes themselves each time they come in contact with the device test pads. Such two-dimensional test probe arrays can be large in order to match the size of each DUT, limiting the number which can be stored in a costly and finite cleanroom space. Even in test methods which include automated replacement of damaged and/or worn-out probe cards, a high rate of probe wear combined with a small number of large, two-dimensional replacement probe cards in storage can result in more equipment downtime and more frequent human intervention. Moreover, even in cases where replaceable probe cards are smaller, the test systems and methods are not well-optimized for fully-automated replacement and calibration of the probe cards, relying on unreliable electro-mechanical connections and cabling incompatible with robotic movement.

To address the above-mentioned challenges, the present disclosure provides example test systems and methods for testing DUTs at a high rate of throughput and with a high degree of automation. The example test systems and methods can provide substantial time- and cost-savings to the manufacture of devices, while increasing maintenance intervals and thus reducing system downtime.

In some embodiments, a test system can include a metrology station, a replacement station, an electrical station, and an equipment module. In some embodiments, the metrology station can include a replaceable probe card, a probe card manipulator, a probe receptacle for the replaceable probe card, and a registration station for use in calibration and/or system diagnostics. In some embodiments, the replacement station can include an automated mechanism, such as a robotic arm or other automated solution configured to remove the replaceable probe card from the probe receptacle, and a probe card holder configured to store both new probe cards and worn-out probe cards after consumption. In some embodiments, the electrical station can include an electrical acquisition system and a control computer, and the equipment module can include a DUT loading port and a wafer loading robot.

In some embodiments, a test method can include grabbing an attach point of the replaceable probe card from the probe card holder with the robotic arm, attaching the probe card to the probe receptacle, calibrating the replaceable probe card on the registration station, and testing a plurality of individual devices of a DUT with a plurality of probes on the replaceable probe card. In some embodiments, the test method can further include determining if the replaceable probe card meets performance specifications, removing the replaceable probe card from the probe receptacle by grabbing the attach point with the robotic arm in response to determining that the replaceable probe card fails to meet performance specifications, and depositing the worn-out replaceable probe card in the probe card holder.

In some embodiments, the testing method can include sequentially testing multiple arrays of individual devices of a DUT using an array of probes, while the array of probes remains in physical contact with the DUT. In some embodiments, the array of probes maintains intermittent contact with the DUT. The sequential testing can include moving the array of probes and/or the DUT, while maintaining physical contact between the array of probes and the DUT. The moving can bring, for each successive array of the multiple arrays of individual devices, the array of probes (i) into parallel electrical contact with a set of contacts associated with the array of individual devices to drive parallel (i.e. simultaneous) electrical excitation of the array of individual devices, then (ii) out of electrical contact with the set of contacts associated with the array of individual devices. The test method can additionally include detecting electrical and/or optical signals emitted from each array of individual devices of the multiple arrays of individual devices based on the electrical excitation thereof.

In some embodiments, each probe of the array of probes can include a flexible probe end which flexes on physical contact with the DUT. The moving can translate the array of probes over a surface of the DUT having a variation in flatness corresponding to the arrays of individual devices, and the array of probes can flex and maintain physical contact with the DUT while moving over the arrays of individual devices. The motion of the DUT relative to the removable probe card can result in the array of probes moving across the DUT with a continuous movement and consistent speed.

In some embodiments, DUTs can include discrete devices, arrays of devices, or a combination thereof. In some embodiments, DUTs can include intact wafers of devices, singulated wafers of devices, or singulated devices disposed on wafer hoops, wafer rings, or other intermediate device carrier structures. In some embodiments, the individual devices of DUTs can be micro light-emitting diode (also known as "microLED" or "μLED") devices. In other embodiments, the individual devices of DUTs can be organic light-emitting diode (OLED) devices, laser devices, photodiode devices, or other optoelectronic devices. In other embodiments, the individual devices of DUTs can be electronic semiconductor devices, or micro-electro-mechanical systems (MEMS).

FIG. 1 illustrates a block diagram of a test system 100, according to some embodiments. Test system 100 can be configured for high-throughput testing of DUTs. Test system 100 can be configured to be compatible with cleanroom environments and high degrees of automation, such that particle emissions can be kept to a minimum, DUT loading and unloading can be partly- or fully-automated, and/or all subsystems and components can be readily serviceable. In some embodiments, test system 100 can be contained within an external enclosure.

In some embodiments, test system 100 can include (i) a user computer 104, (ii) a metrology station 110, (iii) a probe card manipulator 120, (iv) an electrical station 130, (v) a replacement station 140, (vi) an equipment module 150, and (vii) a DUT prober 160. User computer 104 can be connected to a fab network 170 via a communications interface, in accordance with some embodiments. One example of communications between the components of test system 100 is illustrated by arrows, as shown in FIG. 1. In some embodiments, communications between components of test system 100 without a directly illustrated connection can be enabled via transitive connections.

In some embodiments, metrology station 110 can include a collection of equipment for testing a DUT 116, and can include equipment either in direct contact with DUT 116 or in close proximity to DUT 116. In some embodiments, metrology station 110 can be positioned in the center of test system 100. In some embodiments, metrology station 110 can include (i) a fan filter unit 112, (ii) a first optical system 164, and (iii) a probe card assembly 118. In some embodiments, metrology station 110 can also include DUT prober 160 in its entirety. In other embodiments, metrology station 110 can include only a portion of DUT prober 160.

In some embodiments, fan filter unit 112 can be configured to exhaust air from test system 100 into its surrounding environment and/or intake air from the surrounding environment into test system 100. In some embodiments, fan filter unit 112 can include an air filter to limit particulate matter from entering test system 100 and/or its surrounding environment. In some embodiments, first optical system 164 can include lenses, one or more camera systems, and/or optical spectrometers (not shown) and can be configured to detect optical signals emitted from DUT 116. In some embodiments, first optical system 164 can further include illumination sources, such as LED and laser sources. In some embodiments, probe card assembly 118 can be configured to perform tests on DUT 116. During the testing of DUT 116, probe card assembly can be brought into physical contact with DUT 116, and can be configured to apply a bias. Components of probe card assembly 118 are discussed in detail below with reference to FIGS. 3-6, 7A, and 7B.

In some embodiments, probe card manipulator 120 can be configured to manipulate probe card assembly 118, which can be attached to probe card manipulator 120. Probe card manipulator 120 can be configured to move probe card assembly 118 between three locations, (i) DUT 116, (ii) registration station 174, and (iii) replacement station 140. In some embodiments, probe card manipulator 120 can be physically positioned between metrology station 110 and replacement station 140. Probe card manipulator 120 can be manipulated (e.g., rotated) to transfer probe card assembly 118 from metrology station 110 to a location near replacement station 140 for probe card assembly 118 to be grabbed by robotic arm 134 in replacement station 140. In some embodiments, probe card manipulator 120 can be connected to robotic arm 134 and probe card assembly 118 via a communications interface. In some embodiments, probe card manipulator 120 can actuate with six degrees of freedom. Actuators driving probe card manipulator 120 can include direct-drive actuators, stepper motors, brushed and brushless DC motors, DC servo actuators, voice coil actuators, modular piezoelectric actuators, screw piezoelectric actuators, inertia piezoelectric actuators, vacuum-compatible piezoelectric actuators, amplified piezoelectric actuators, or a combination thereof.

In some embodiments, electrical station 130 can be configured to provide power to the test system 100, control various functions of test system 100 via communications interfaces, and/or acquire electrical signals during the testing of DUT 116. Electrical station 130 can be positioned adjacent to metrology station 110 to enable shorter communications links and minimize electrical signal interferences and crosstalk. In some embodiments, electrical station 130 can include a utility station 122 and a power station 124. Utility station 122 can include an electrical acquisition system 162 and a control computer 126. Electrical acquisition system 162 can be connected to first optical system 164 and probe card assembly 118 via a communications interface. Control computer 126 can be connected to electrical acquisition system 162, first optical system 164, second optical system 172, and user computer 104 via a communications interface. In some embodiments, electrical acquisition system 162 and first optical system 164 are collectively referred to as acquisition system 161.

In some embodiments, replacement station 140 can be configured to replace used probe cards with new probe cards, which are part of probe card assembly 118, as discussed in detail below. Replacement station 140 can be positioned adjacent to metrology station 110 to minimize travel distance of probe cards between metrology station 110 and replacement station 140 during the probe card replacement process. In some embodiments, replacement station 140 can include a probe card holder 132 and an automated multi-axis robotic system 134 (also referred to as "a robotic system 134" or a "a robotic arm 134"). In some embodiments, probe card holder 132 can be configured to store a total of about 50 or more used probe cards and new probe cards. In some embodiments, robotic arm 134 can actuate with six degrees of freedom. Actuators driving robotic arm 134 can include direct-drive actuators, stepper motors, brushed and brushless DC motors, DC servo actuators, voice coil actuators, modular piezoelectric actuators, screw piezoelectric actuators, inertia piezoelectric actuators, vacuum-compatible piezoelectric actuators or amplified piezoelectric actuators.

In some embodiments, equipment module 150 can store DUTs, such as DUT 116 prior to testing and/or after testing of DUT 116 is complete. Equipment module 150 can be positioned adjacent to metrology station 110 in order to minimize travel distance of DUT 116 between metrology station 110 and equipment module 150 during the testing of DUT 116. In some embodiments, equipment module 150 can include a load port 142, a loading robot 144, and a pre-aligner 146. Load port 142 can be configured to store DUTs, pre-aligner 146 can be configured to position DUTs such that they are oriented correctly for insertion into metrology station 110, and loading robot 144 can be configured to transfer DUT 116 between load port 142 and DUT holder 114 in DUT prober 160. In some embodiments, equipment module 150 can be connected to a handling cloud 180 via a communications interface and can be connected to a defect station 180 through handling cloud 190.

In some embodiments, DUT prober 160 can provide a stable, low vibration physical base on which DUT 116 can be disposed. DUT prober 160 can be located entirely within, or partly within, metrology station 110. DUT prober 160 can include (i) a DUT holder 114 configured to hold DUT 116 during the testing of DUT 116, (ii) a second optical system 172 positioned below DUT holder 114, (iii) a stage 179 positioned below second optical system 172, and in physical contact with DUT holder 114, (iv) a granite table 178 positioned below stage 179 and in physical contact with stage 179, (v) a vibration isolation system 176 in physical contact with granite table 178, and (vi) a registration station 174 positioned near DUT holder 114. In some embodiments, vibration isolation system 176 can be in direct contact with a floor of the location where test system 100 is located. In some embodiments, vibration isolation system 176 can be disposed between granite table 178 and stage 179, and granite table 178 can be in direct contact with a floor of the location where test system 100 is located.

DUT holder 114 can be configured to hold DUT 116 via a vacuum release system, a mechanical latch, or electrostatic forces, among other embodiments. Second optical system 172 can include lenses, one or more camera systems, and/or optical spectrometers (not shown) and can be configured to detect optical signals emitted from DUT 116. In some embodiments, second optical system 172 can further include illumination sources, such as LED and laser sources. Stage 179 can be configured to translate in- and out-of plane, as well as rotate in-plane, to enable accurate placement of DUT 116 relative to probe card assembly 118 prior to testing DUT 116, and/or can be configured to move relative to probe card assembly 118 during testing of DUT 116. The granite table 178 and vibration isolation system 176 in combination can minimize the impact of environmental vibrations on measurements of DUT 116.

In some embodiments, DUT 116 can include discrete devices, arrays of devices, or a combination thereof. In some embodiments, DUT 116 can include intact wafers of devices, singulated wafers of devices, or singulated devices disposed on wafer hoops, wafer rings, or other intermediate device carrier structures. In some embodiments, the individual devices of DUT 116 can be micro light-emitting diode (microLED) devices. In other embodiments, the individual devices of DUT 116 can be organic light-emitting diode (OLED) devices, laser devices, photodiode devices, or other optoelectronic devices. In other embodiments, the individual devices of DUT 116 can be electronic semiconductor devices, or micro-electro-mechanical systems (MEMS).

Figure 2:
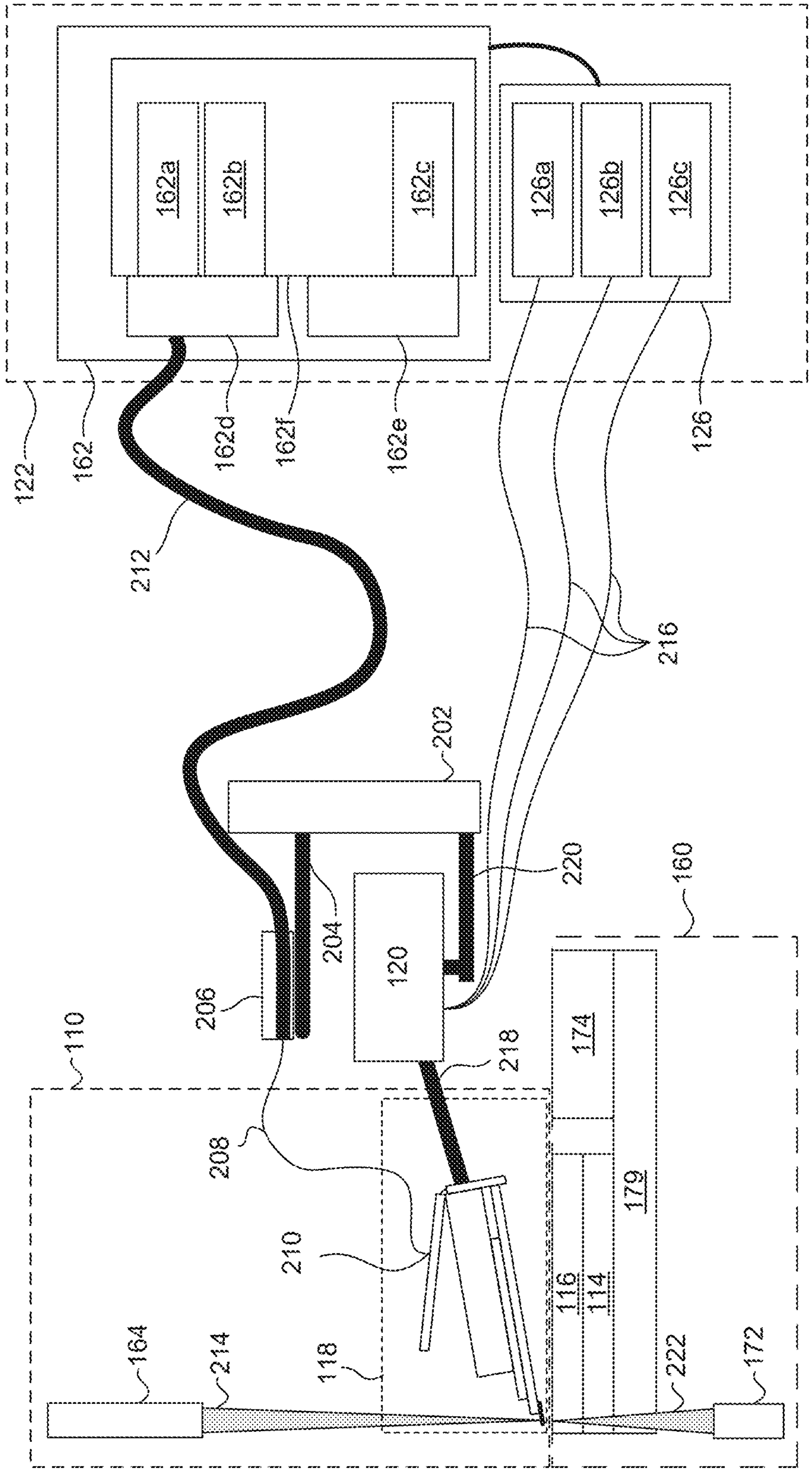
FIG. 2 illustrates schematics of a metrology station and an electrical station of a test system, in accordance with some embodiments.

FIG. 2 illustrates schematics of metrology station 110, probe card manipulator 120, utility station 122, and DUT prober 160 of test system 100, and additional components of test system 100 not shown in FIG. 1 for simplicity. The discussion of elements in FIGS. 1 and 2 with the same annotations applies to each other, unless mentioned otherwise. Metrology station 110 can include probe card assembly 118, which can be positioned above stage 179, DUT holder 114, DUT 116, and registration station 174. In some embodiments, a top surface of registration station 174 can be substantially coplanar with a top surface of DUT 116.

Referring to FIG. 2, in some embodiments, probe card assembly 118 can be attached to probe card manipulator 120 via a manipulator arm 218. Probe card manipulator 120 can be physically supported by a manipulator support 220, which can be physically supported by a bridge 202. Bridge 202 can be mechanically affixed to a stationary portion of metrology station 110. Probe card manipulator 120 can be connected to control computer 126 via a set of control cables 216. Control computer 126 can include a yaw controller 126*a*, a roll controller 126*b*, and an XYZ controller 126*c*, each of which can control a respective motion of probe card manipulator 120. In some embodiments, control computer 126 can also include a pitch controller (not shown).

Control computer 126 can be connected via a communications interface to electrical acquisition system 162. In some embodiments, electrical acquisition system 162 can include a DSUB (D-subminiature) connector 162*d*, a trigger adapter 162*e*, and a chassis 162*f*. Chassis 162*f* can include a signal measurement unit (SMU) 162*a*, an SMU 162*b*, and a triggers card 162*c*. Though two SMUs shown in FIG. 2, electrical acquisition system 162 can have any number of SMUs. Both SMU 162*a* and 162*b* can be connected to DSUB connector 162*d* via a communications interface and triggers card 162*c* can be connected to trigger adapter 162*e* via a communications interface. Triggers card 162*c* can be used to emit and/or receive trigger signals provided to and/or received from SMU 162*a* or SMU 162*b*. In order to support a high testing throughput, in some embodiments, the entire electrical path from DUT 116 through DSUB connector 162*d* can support at least 64 independent measurement channels. In some embodiments, SMU 162*a* and SMU 162*b* can be replaced with a custom multi-voltage driver which applies a plurality of predefined voltages to DUT 116 and measures a current at each predefined voltage.

In some embodiments, probe card assembly 118 can be electrically connected to SMU 162*a* and/or SMU 162*b* through DSUB connector 162*d* via a soldered wire 210, a spread wire 208, and a shielded cable 212. In some embodiments, a bias can be applied to DUT 116 from SMU 162*a* and/or SMU 162*b* through probe card assembly 118 and a current can be measured. In some embodiments, a current can be applied to DUT 116 from SMU 162*a* and/or SMU 162*b* through probe card assembly 118 and a bias can be measured. In some embodiments, shielded cable 212 can be physically supported by a cable chain 206 and cable chain 206 can be physically supported by a cable holder 204, which can be physically supported by bridge 202.

In some embodiments, DUT 116 can emit an optical signal 214 in response to an electrical excitation received via probe card assembly 118. The emitted optical signal 214 can be substantially normal to a top surface of DUT 116 and can be detected by first optical system 164. In some embodiments, DUT 116 can also emit an optical signal 222 in response to an electrical excitation received via probe card assembly 118. The emitted optical signal 222 can be substantially normal to a bottom surface of DUT 116 and can be detected by second optical system 172. In some embodiments, optical signals 214 and 222 can include reflected illumination originating from first optical system 164 or second optical system 172. In some embodiments, optical signals 214 and 222 can be emitted in the form of electroluminescence, which can be generated from DUT 116 in response to an electrical excitation applied to DUT 116 via probe card assembly 118. In some embodiments, optical signals 214 and 222 can be emitted in the form of photoluminescence, which can be generated from DUT 116 in response to an optical excitation applied to DUT 116 from illumination sources in either first optical system 164 or second optical system 172. In some embodiments, optical signals 214 and 222 can include a combination of reflected illumination, electroluminescence, and/or photoluminescence.

Figure 3:
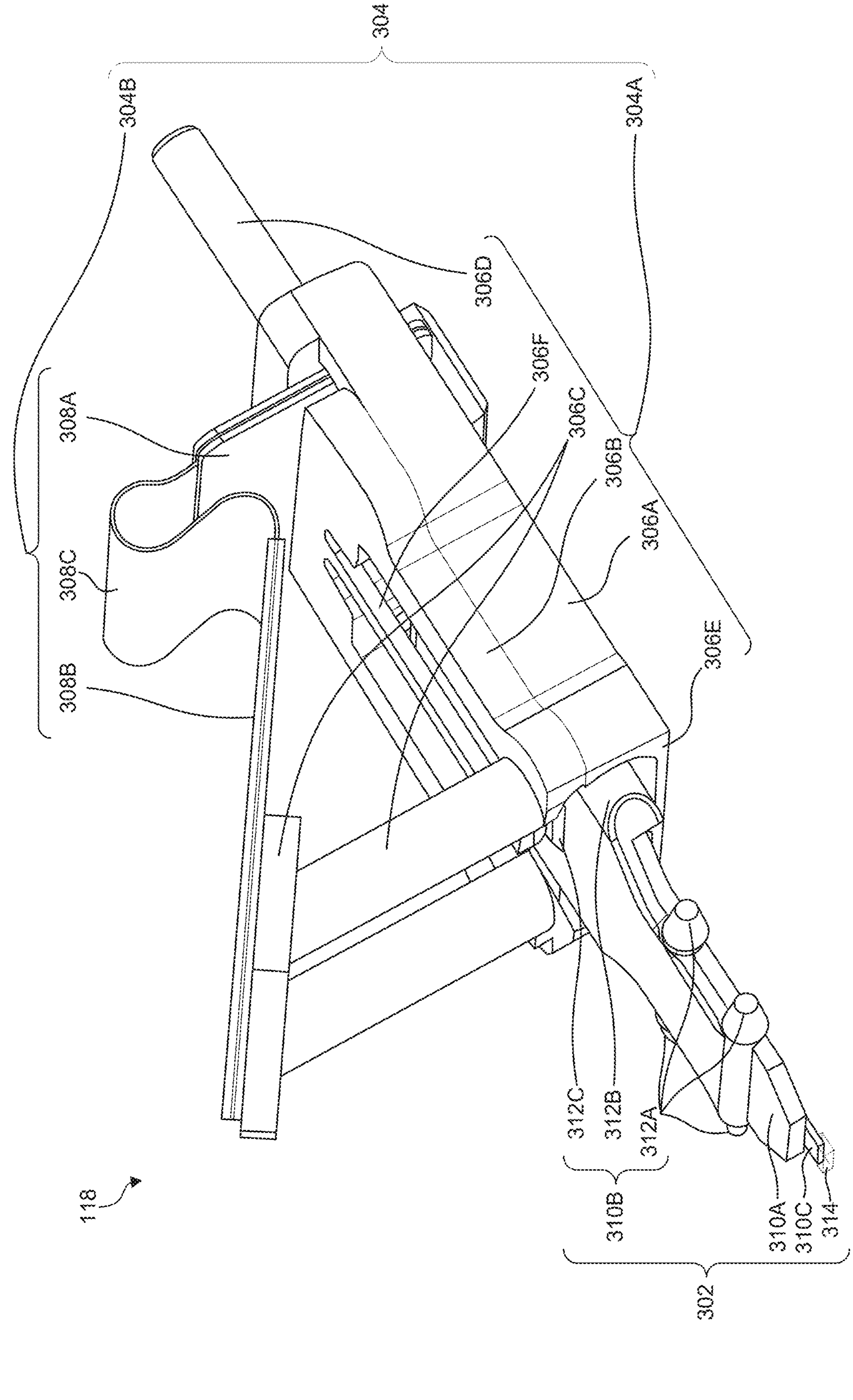
FIGS. 3-6 and 7A-7C illustrate different views and components of a probe card assembly of a test system, in accordance with some embodiments.
Figure 4:
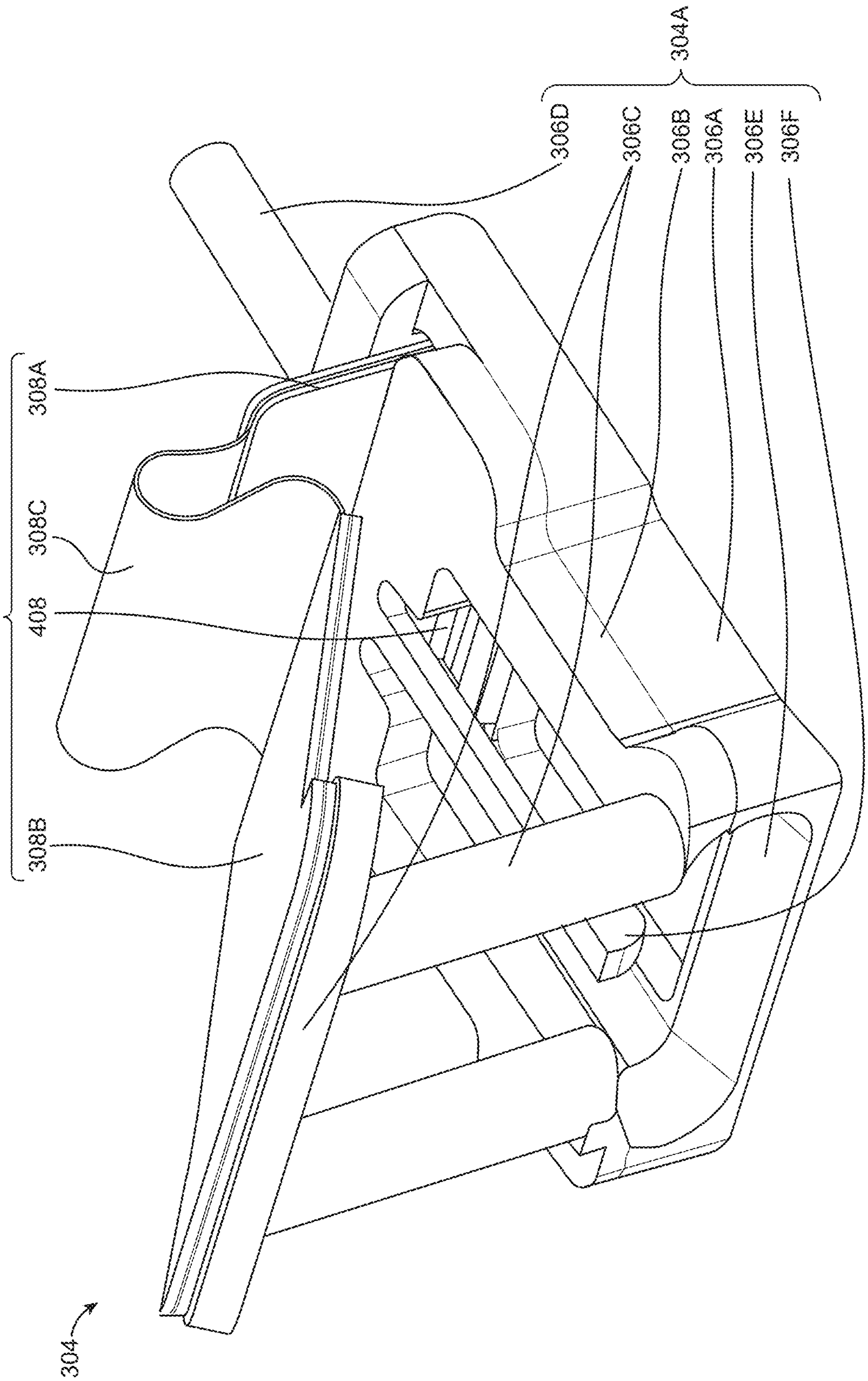
Figure 5:
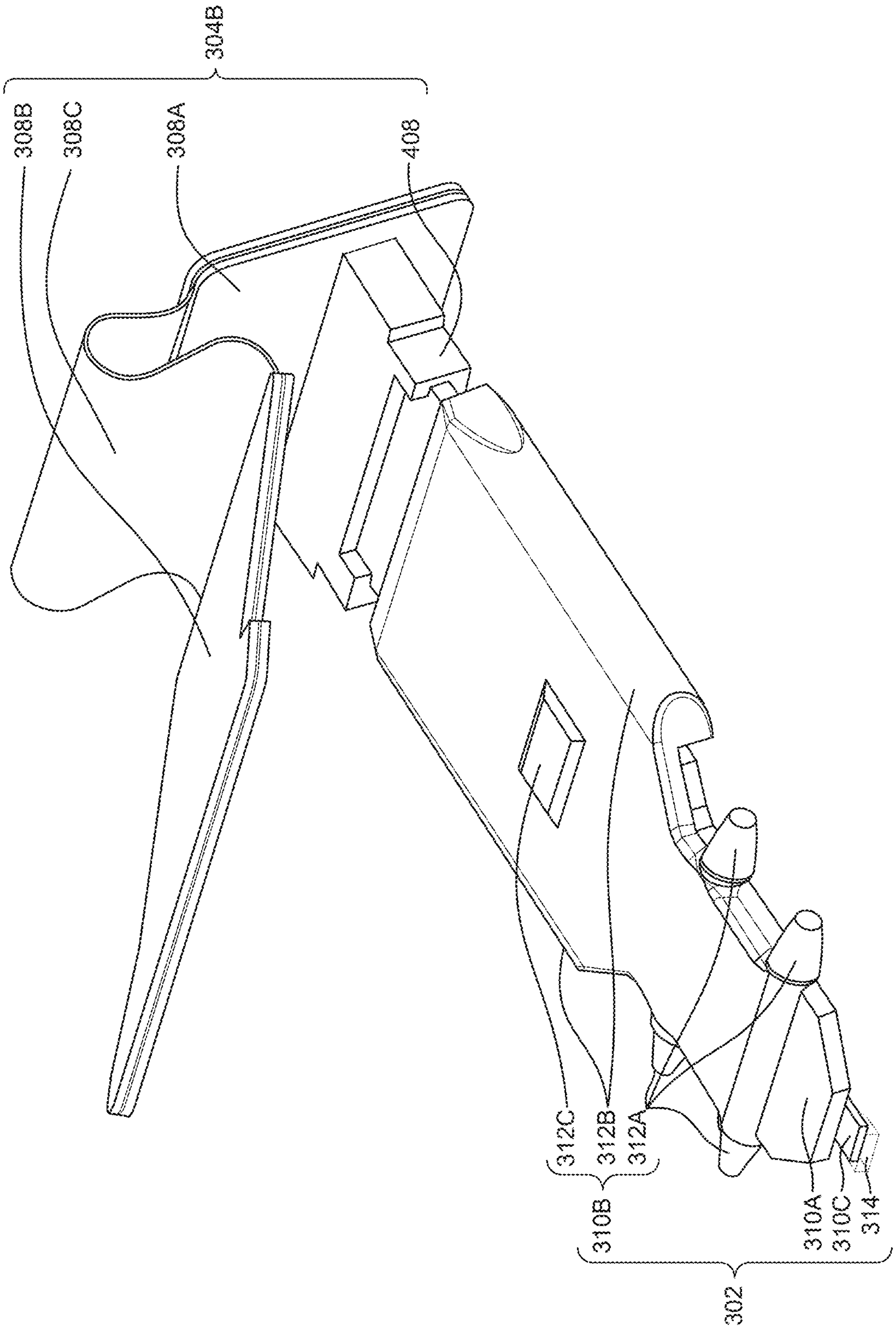
Figure 6:
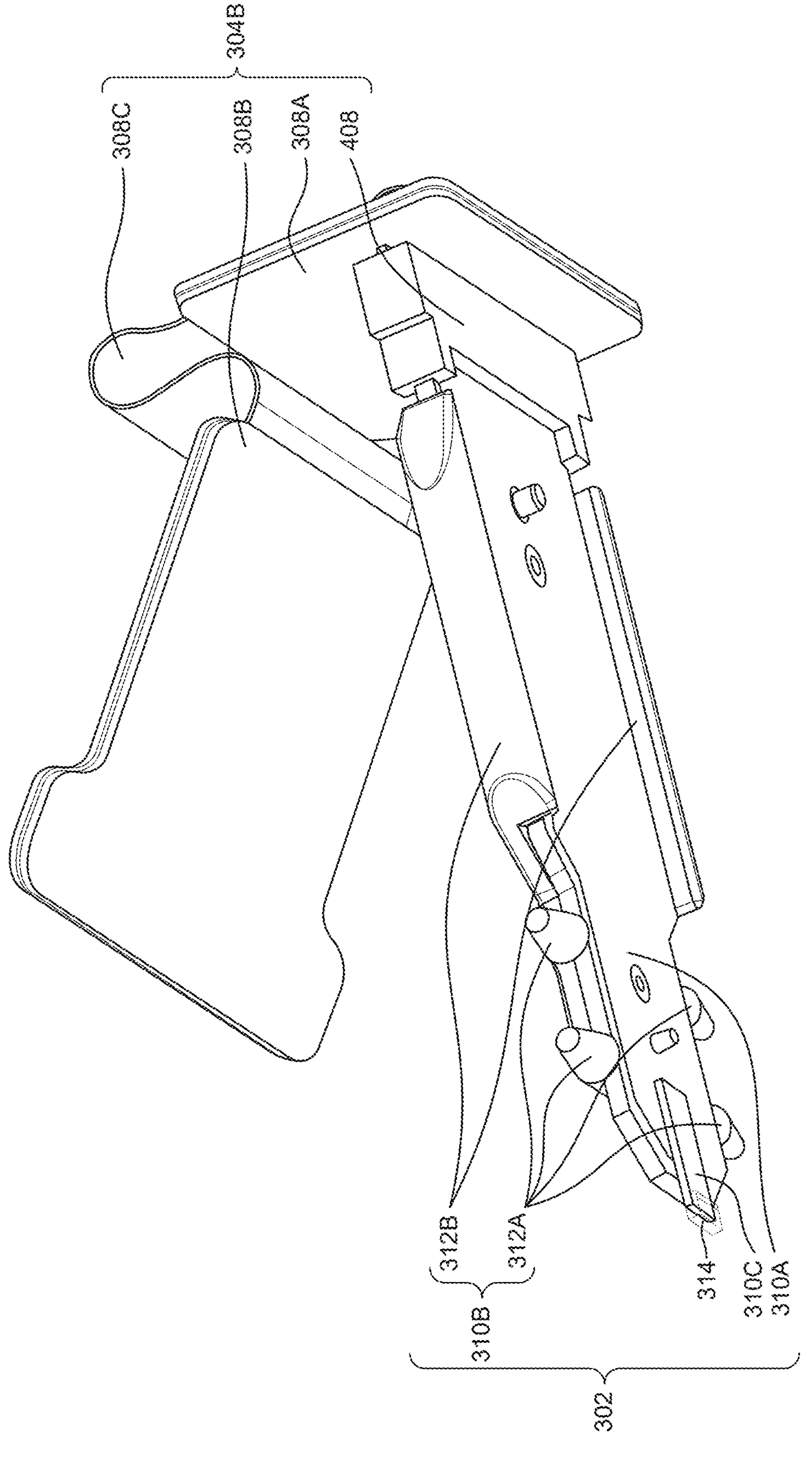

FIGS. 3-6, 7A, and 7B illustrate different views and components of probe card assembly 118 of test system 100, according to some embodiments. Referring to FIG. 3, in some embodiments, probe card assembly 118 can include (i) a probe card 302 and (ii) a probe receptacle 304, which can include (i) a receptacle holster 304A and (ii) a receptacle printed circuit board (PCB) assembly 304B. In some embodiments, receptacle PCB assembly 304B can be a rigid-flex-rigid PCB assembly 304B. FIG. 4 illustrates a different view of probe receptacle 304, without showing probe card 302 for simplicity, according to some embodiments. FIGS. 5 and 6 illustrate different views of probe card 302 and receptacle PCB assembly 304B, without showing receptacle holster 304A for simplicity, according to some embodiments.

Referring to FIGS. 3 and 4, probe receptacle 304 can be configured to hold probe card 302. FIG. 3 illustrates probe receptacle 304 while attached to probe card 302 and FIG. 4 illustrates probe receptacle 304 while detached from probe card 302, according to some embodiments. Probe receptacle 304 can provide an electromechanical interface for the attachment of probe card 302 through its components—receptacle holster 304A and receptacle PCB assembly 304B. Receptacle holster 304A can be configured to hold probe card 302 and provide mechanical support for probe card 302, while receptacle PCB assembly 304B can provide electrical interface to probe card 302. The components of receptacle holster 304A can be composed of metal and/or metal alloys, including aluminum, stainless steel, or titanium, among other potential materials. In some embodiments, receptacle holster 304A can include (i) a holster base 306A, (ii) a holster lid 306B fastened to holster base 306A, (iii) a holster platform 306C fastened to holster lid 306B, (iv) a receptacle shaft 306D protruding from holster base 306A, and (v) a rail guide 306E. In some embodiments, holster lid 306B can include a holster clip 306F, which can be configured to hold probe card 302 in position after being inserted into receptacle holster 304A. Receptacle shaft 306D can mechanically attach receptacle holster 304A to manipulator arm 218 of probe card manipulator 120 during the manipulation of probe card assembly 118 as discussed above. Rail guide 306E can include a tapered opening to aid in the insertion of probe card 302 into receptacle holster 304A, effectively relaxing the need for placement accuracy of robotic arm 134 during the insertion of probe card 302 into receptacle holster 304A.

Receptacle PCB assembly 304B can be attached to spread wire 208 via soldered wire 210 (not shown), through which an electrical signal can be provided to probe card 302. Referring to FIGS. 3-6, receptacle PCB assembly 304B can include, (i) a first receptacle PCB 308A, (ii) a second receptacle PCB 308B, (iii) a ribbon cable 308C, and (iv) an integrated circuit (IC) socket 408 (visible in FIGS. 4-6, not visible in FIG. 3). First receptacle PCB 308A can be attached to a first end of ribbon cable 308C and second receptacle PCB 308B can be attached to a second end of ribbon cable 308C. One end of first receptacle PCB 308A can be attached to holster platform 306C and another end of first receptacle PCB 308B can be attached to ribbon cable 308C. IC socket 408 can provide an electrical interface to probe card 302 when attached to IC socket 408 via probe PCB 310A of probe card 302, as shown in FIGS. 5 and 6. In some embodiments, IC socket 408 can be a zero insertion force (ZIF) socket to preferably keep the force applied on probe receptacle 304 upon insertion or removal of probe card 302 into or out of IC socket 408 less than 5N. If the force is greater than 5N, then the size and manufacturing cost of probe card manipulator 120 and its underlying support structure may increase.

Referring to FIGS. 3, 5, and 6, probe card 302 can provide a mechanically stable platform for transporting electrical signals from DUT 116 to receptacle PCB assembly 304B during the testing of DUT 116. In order to maximize the number of probe cards 302 which fit in probe card holder 132, probe card volume can be minimized. In some embodiments, probe card 302 can be limited to a total volume of 33 $cm^3$, which can enable up to 50 probe cards 302 to fit in some embodiments of probe card holder 132. Other total volumes and probe card capacities are also possible, and are within the spirit and scope of the disclosed system. In order to reduce wear and maintenance costs on robotic arm 134 and/or probe card manipulator 120, probe card 302 mass can be kept to a minimum. For embodiments in which actuation of robotic arm 134 and/or probe card manipulator 120 is driven via a piezoelectric-type actuator, probe card 302 can be limited to a maximum mass of about 100 g, for example, so as not to damage the piezoelectric elements. Other values of maximum masses are also possible, and are within the spirit and scope of the disclosed system.

In some embodiments, probe card 302 can include (i) a probe PCB 310A, (ii) a PCB jacket 310B attached to probe PCB 310A, and (iii) a probe array chip 310C. PCB jacket 310B can be wrapped around the sidewalls of probe PCB 310A, as shown in FIGS. 5 and 6. In some embodiments PCB jacket 310B can be composed of polyetheretherketone (PEEK) or polyetherketoneketone (PEKK), among other potential materials, to minimize the weight of probe card 302 while maintaining mechanical strength and cleanroom compatibility via low particulate generation. In some embodiments, PCB jacket 310B can include (i) a set of jacket attach points 312A (also referred to as "grab points 312A"), (ii) a set of jacket rails 312B, and (iii) a clip bump 312C. Jacket attach points 312A can have a tapered conical structure that extend outwards from sidewalls of PCB jacket 310B. Jacket attach points 312A can be used as grab points by robotic arm 134 to securely hold probe card 302 during the transportation of probe card 302 between probe card holder 132 and probe card manipulator 120. In some embodiments, jacket attach points 312A can be replaced with PCB attach points formed in the PCB (not shown), and PCB attach points can be used as grab points by robotic arm 134 to securely hold probe card 302 during transportation of probe card 302 between probe card holder 132 and probe card manipulator 120. Jacket rails 312B can be positioned on sidewalls of probe PCB 310A and can assist probe card 302 to slide along the tapered opening of rail guide 306E with ease during the insertion of probe card 302 into receptacle holster 304A and the attachment of probe PCB 310A to IC socket 408, as discussed above. Clip bump 312C can provide a raised region for holster clip 306F to hold down probe card 302 in place after being inserted into probe receptacle 304.

In some embodiments, probe array chip 310C can be a MEMS chip, which can include a flexible probe array 314 for making contact with DUT 116. Probe array chip 310C can be attached to probe PCB 310A with a mechanically robust material such as an epoxy, with electrical connections between probe array chip 310C and probe PCB 310A formed with wire bonding. In some embodiments, probe array chip 310C can be attached to probe PCB 310A with flip-chip bonding.

Probe array chip 310C can include a probe array 314, which can include a one-dimensional array of flexible probes that can flex or bend on physical contact with DUT 116 during the testing of DUT 116. The configuration (e.g., pitch and geometry) of the flexible probes in probe array 314 can be aligned with the layout configuration of the individual devices of DUT 116. In some embodiments, each of the flexible probes in probe array 314 can be formed of a conductive and flexible material. In some embodiments, each of the flexible probes in probe array 314 can be formed of a metal, silicon, silicon nitride, a polymer, silicon coated with gold or other conductive material, silicon nitride coated with a conductive material, a polymer coated with a conductive material, or other suitable conductive and flexible materials.

Figure 7A:
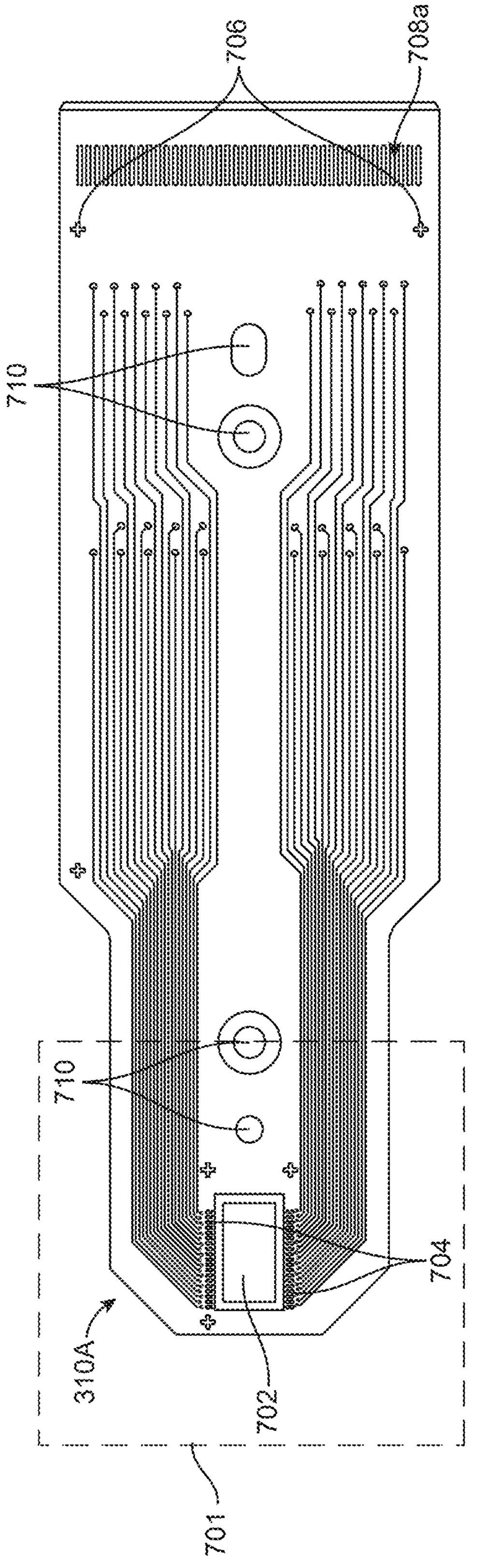
Figure 7B:
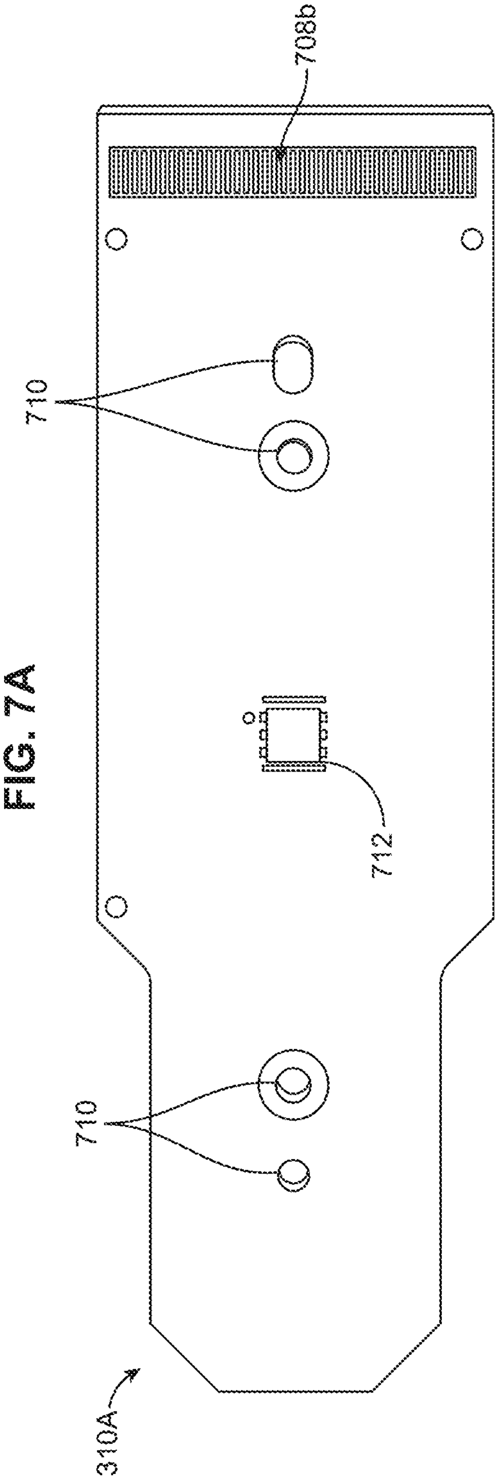

FIGS. 7A and 7B illustrate a top view and a bottom view, respectively, of probe PCB 310A, according to some embodiments. The top surface of probe PCB 310A can include (i) a probe chip landing 702, (ii) a probe pad array 704, (iii) a set of probe PCB fiducials 706, (iv) a set of PCB attach points 710, (v) PCB traces 720, and (vi) probe PCB pads 708*a*, according to some embodiments. The bottom surface of probe PCB 310A can include a probe PCB chip 712 and probe PCB pads 708*b*, according to some embodiments.

Probe chip landing 702 can serve as the electrically insulated region where probe array chip 310C can mechanically attach to probe PCB 310A, while electrical connections between probe array chip 310C and probe PCB 310A can be made with wire bonding to probe pad array 704. The electrical connection between probe pad array 704 and probe PCB pads 708A can be mediated by PCB traces 720. Probe PCB fiducials 706 can be used to aid in alignment during the mechanical attach process between array chip 310C and probe PCB 310A. In some embodiments, probe chip landing 702 and probe pad array 704 can be replaced with an array of bump pads for attaching probe array chip 310C to probe PCB 310A with flip-chip bonding. Electrical traces can run from probe pad array 704 to probe PCB pads 708*a*. Probe PCB pads 708*a* and 708*b* can electrically connect to IC socket 408 after probe card 302 is inserted into probe receptacle 304 and attached to IC socket 408, thus establishing an electrical connection between probe array 314 and electrical acquisition system 162. PCB attach points 710 can assist in the attachment of PCB jacket 310B to probe PCB 310A, and in some embodiments, probe PCB fiducials 706 can be used to aid in alignment during this attachment process.

Figure 7C:
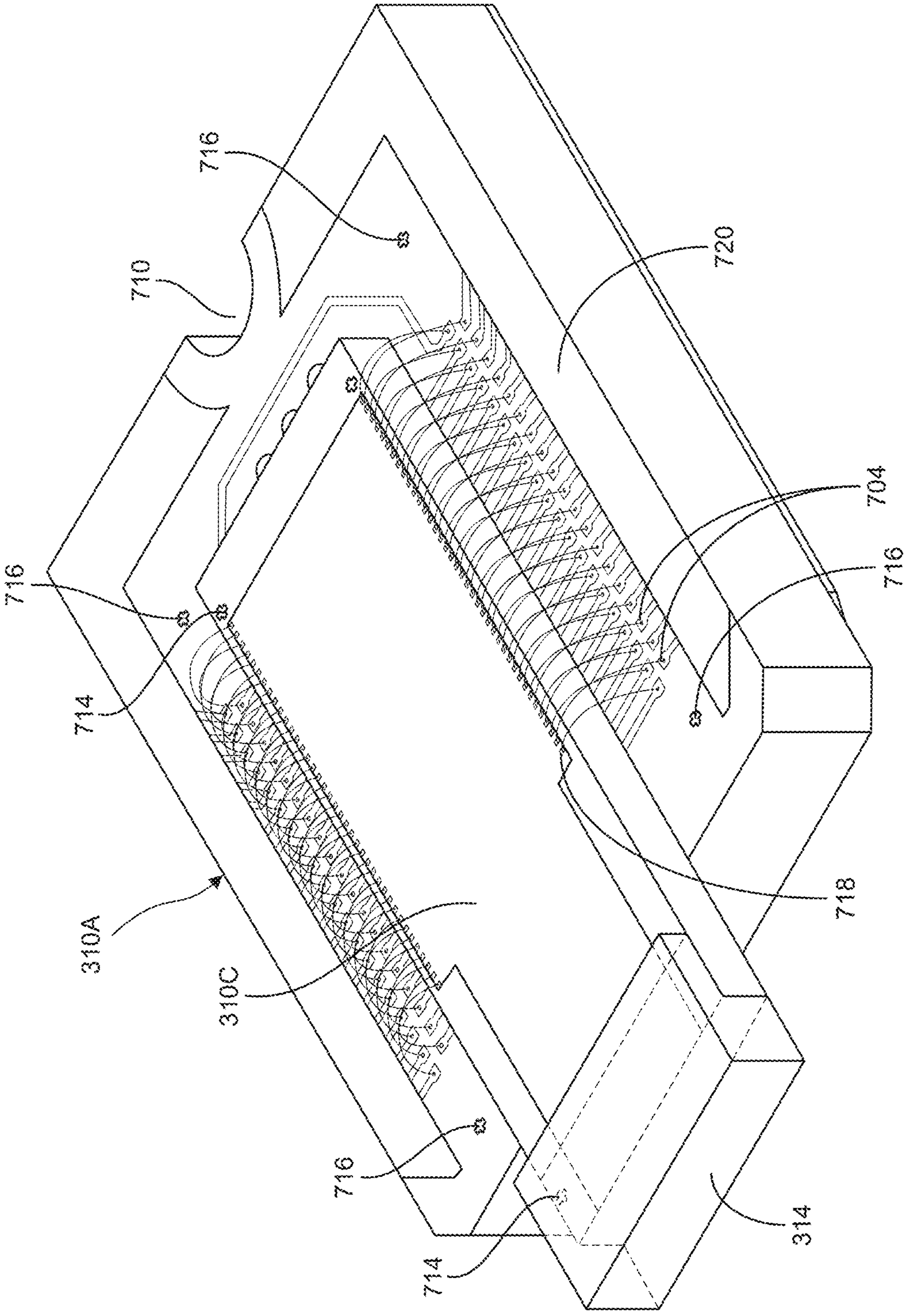

FIG. 7C illustrates a magnified view of region 701 in FIG. 7A, with probe array chip 310C attached on probe chip landing 702, according to some embodiments. Region 701 of probe PCB 310A can include probe array chip 310C attached to probe chip landing 702 (not visible in FIG. 7C), where probe array chip 310C can include probe array 314, chip pad array 718, and probe chip fiducials 714. Electrical connections between probe array chip 310C and probe PCB 310A can be formed via wire bonding between chip pad array 718 and probe pad array 704. In some embodiments, probe array chip 310C includes a trace corresponding with each probe in probe array 314, wherein each trace is fanned out to a wider spacing than the pitch of the probes which constitute probe array 314. In some embodiments, probe pad array 704 includes two staggered rows of bond pads. In some embodiments, traces are fanned out from probe pad array 704 to a wider spacing than the pitch of probe pad array 704 on probe PCB 310A. In some embodiments, probe array chip 310C can be attached to probe PCB 310A with an epoxy. In some embodiments, probe chip fiducials 714 can be imaged relative to PCB chip fiducials 716 in order to aid in attaching probe array chip 310C to probe PCB 310A.

Figure 8:
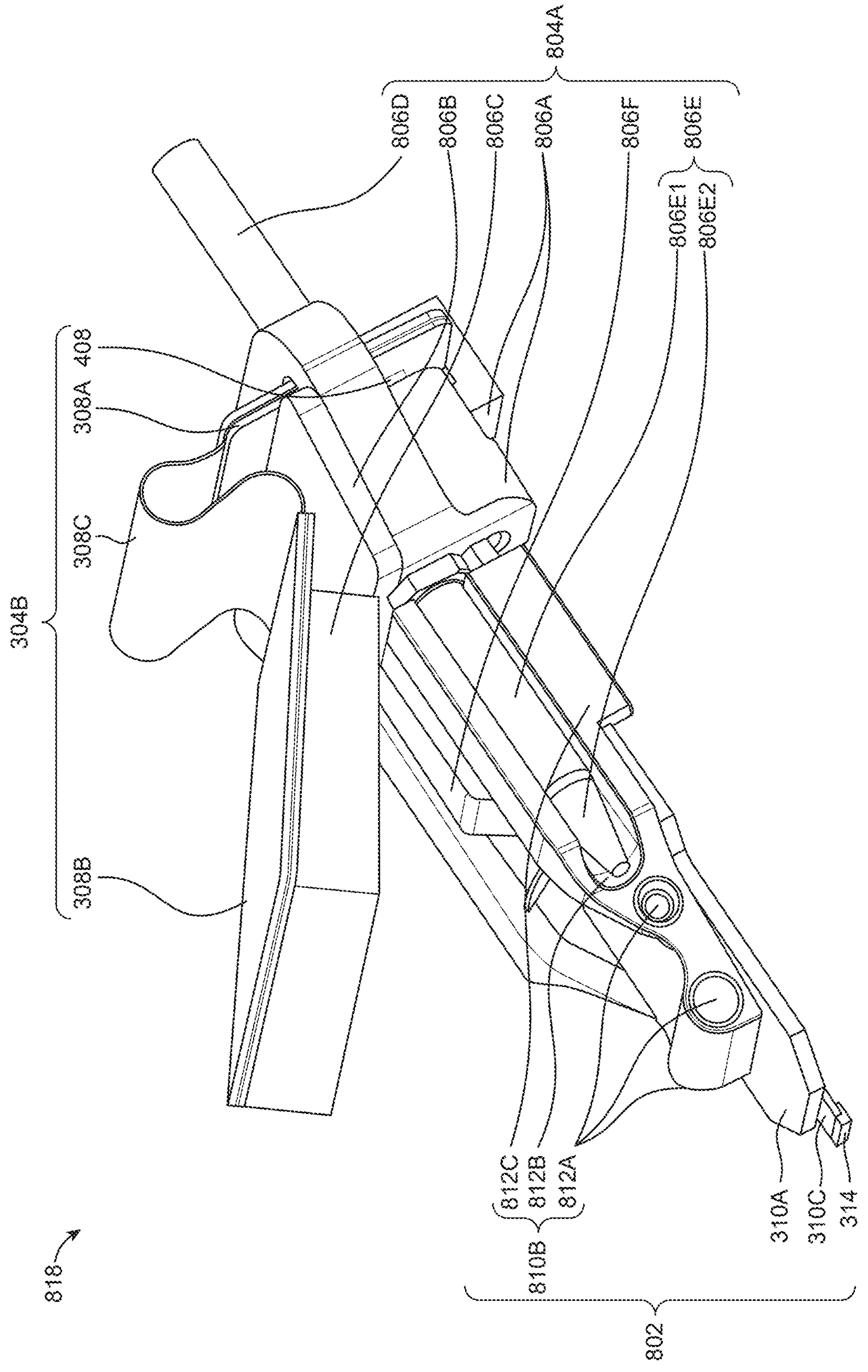
FIGS. 8-11 illustrate different views and components of another probe card assembly of a test system, in accordance with some embodiments.

Referring to FIGS. 8-11, in some embodiments, test system 100 can have probe card assembly 818, instead of probe card assembly 118. In some embodiments, probe card assembly 818 can be replaced with probe card assembly 118 in metrology station 110. In some embodiments, metrology station 110 can utilize multiple probe cards simultaneously (not shown). FIGS. 8-11 illustrate different views and components of probe card assembly, according to some embodiments. Referring to FIG. 8, in some embodiments, probe card assembly 118 can include (i) a probe card 802 and (ii) a probe receptacle 804, which can include a (i) a receptacle holster 804A and (ii) a receptacle printed circuit board (PCB) assembly 304B.

Figure 9:
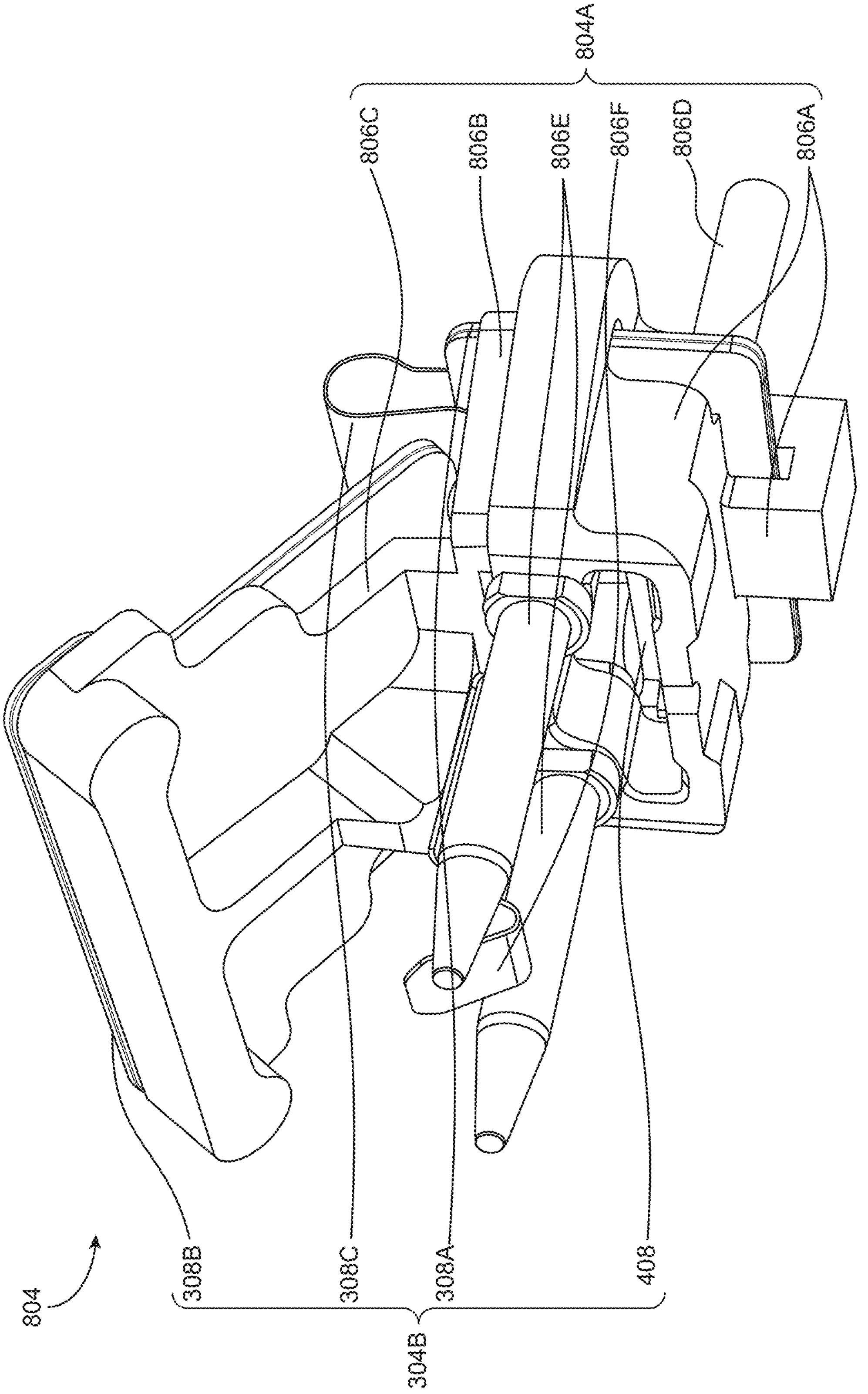
Figure 10:
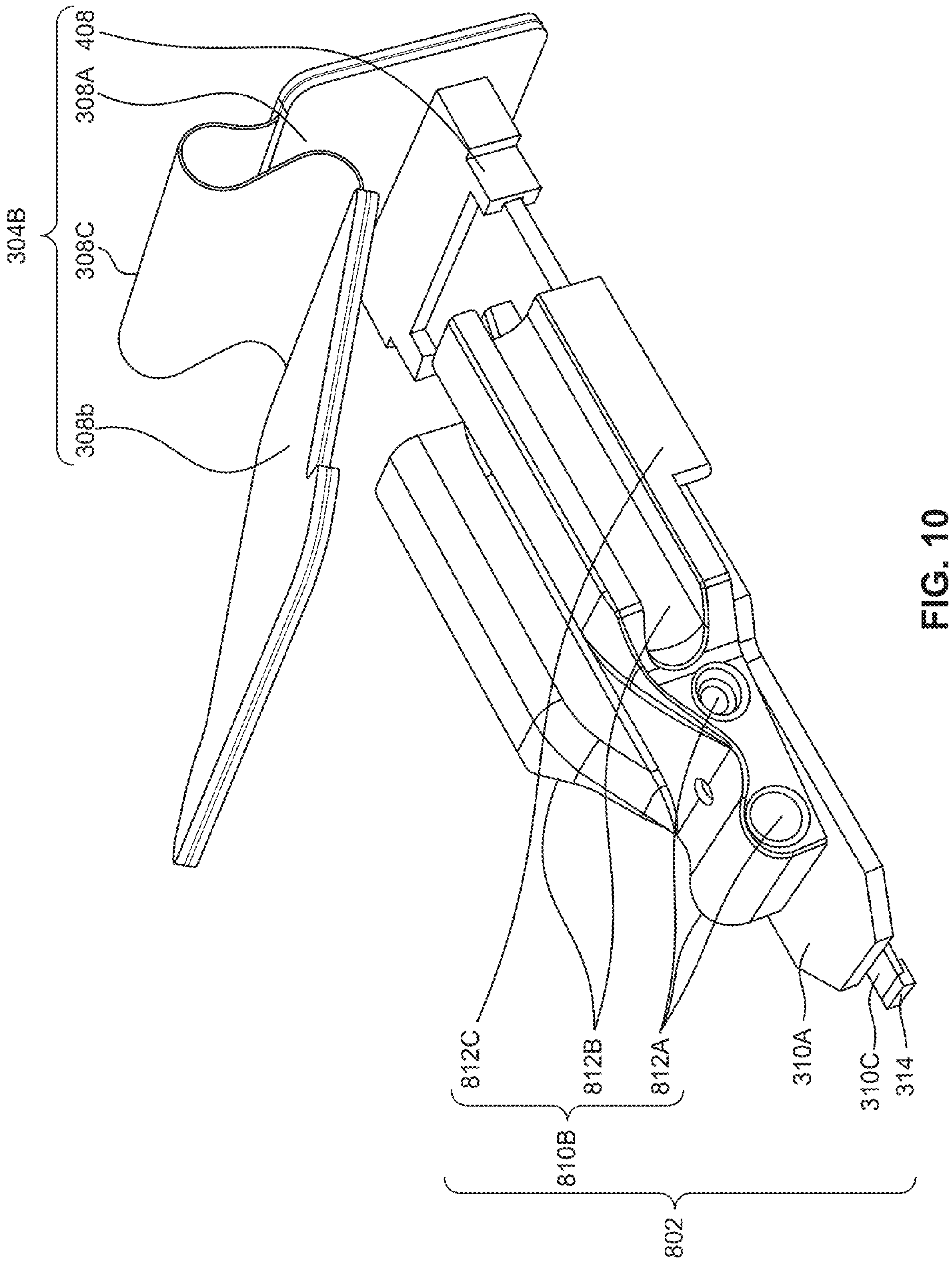
Figure 11:
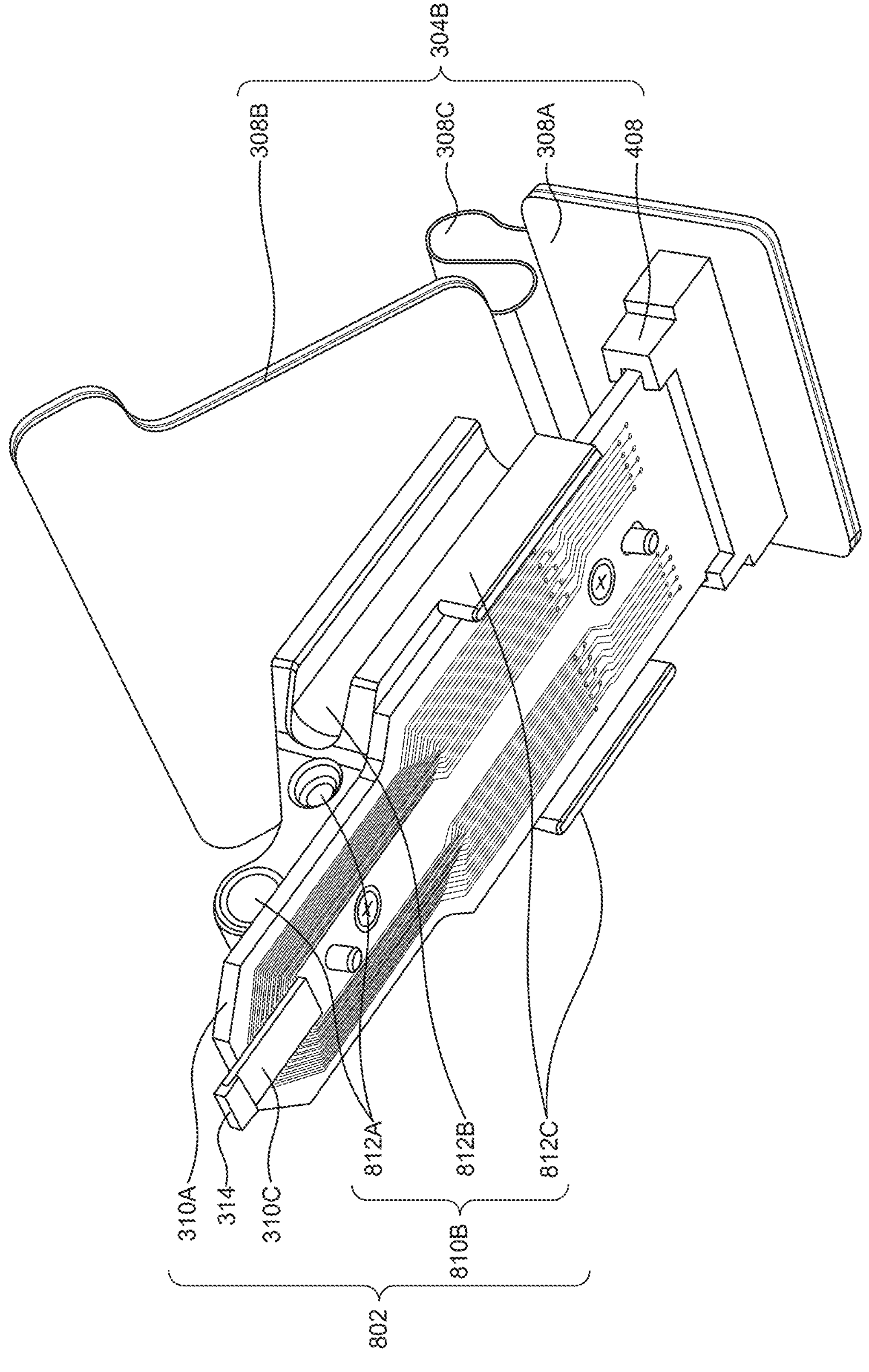

FIG. 9 illustrates a different view of probe receptacle 804, without showing probe card 802 for simplicity, according to some embodiments. FIGS. 10 and 11 illustrate different views of probe card 802 and receptacle PCB assembly 304B, without showing receptacle holster 804A for simplicity, according to some embodiments. The discussion of elements in FIGS. 1-6, 7A, 7B, 7C, and 8-11 with the same annotations applies to each other, unless mentioned otherwise. The discussion of probe card 302 and its components (shown in FIGS. 3, 5, 6, 7A, 7B, and 7C) applies to probe card 802 and its components (shown in FIGS. 8, 10, and 11), unless mentioned otherwise. Similarly, the discussion of probe receptacle 304 and its components (shown in FIGS. 3-6) applies to probe card 804 and its components (shown in FIGS. 8-11), unless mentioned otherwise.

Referring to FIGS. 8 and 9, probe receptacle 804 can be configured to hold probe card 802. FIG. 8 illustrates probe receptacle 804 while attached to probe card 802 and FIG. 9 illustrates probe receptacle 804 while detached from probe card 802, according to some embodiments. Receptacle holster 804A can be configured to hold probe card 802 and provide mechanical support for probe card 802, while receptacle PCB assembly 304B can provide electrical interface to probe card 802. The components of receptacle holster 804A can be composed of metal and/or metal alloys, including aluminum, stainless steel, or titanium, among other potential materials. Probe receptacle 804 can provide an electromechanical interface for the attachment of probe card 802 through its components—receptacle holster 804A and receptacle PCB assembly 304B. Receptacle holster 804 can include (i) a holster base 806A, (ii) a holster lid 806B fastened to holster base 806A, (iii) a holster platform 806C fastened to holster lid 806B, (iv) a receptacle shaft 806D protruding from holster base 806A, and (v) a set of rails 806E protruding from holster base 806A. In some embodiments, holster lid 806B can include a holster clip 806F, which can be configured to hold probe card 802 in position after being inserted into receptacle holster 804A. Receptacle shaft 806D can mechanically attach receptacle holster 804A to manipulator arm 218 of probe card manipulator 120 during the manipulation of probe card assembly 818, similar to the manipulation of probe card assembly 118 discussed above. Rails 806E can include a tapered structure with pointed end to aid in the insertion of probe card 802 into receptacle holster 804A, effectively relaxing the need for placement accuracy of robotic arm 134 during the insertion of probe card 802 into receptacle holster 304A. In some embodiments, each rail 806E can have (i) a bottom portion 806E1 having a cylindrical structure protruding from holster base 806A and (ii) a top portion 806E2 having a conical structure. Receptacle PCB assembly 304B can be attached to spread wire 208 via soldered wire 210 (not shown), which can convey an electrical signal between probe card 802 and spread wire 208. One end of first receptacle PCB 308A can be attached to holster platform 806C and another end of first receptacle PCB 308B can be attached to ribbon cable 308C.

Referring to FIGS. 8, 10, and 11, probe card 802 can provide a mechanically stable platform for transporting electrical signals from DUT 116 to receptacle PCB assembly 304B during the testing of DUT 116. In some embodiments, probe card 802 can include (i) a probe PCB 310A, (ii) a PCB jacket 810B attached to a probe PCB 310A, and (iii) a probe array chip 310C. PCB jacket 810B can be wrapped around the sidewalls of probe PCB 310A, as shown in FIGS. 8, 10, and 11. In some embodiments, PCB jacket 810B can be composed of PEEK or PEKK, among other potential materials, to minimize the weight of probe card 802 while maintaining mechanical strength and cleanroom compatibility via low particulate generation. In some embodiments, PCB jacket 810B can include (i) a set of jacket attach points 812A (also referred to as "grab points 812A"), (ii) a set of rail guides 812B, and (iii) a pair of side flaps 812C. Each of jacket attach points 812A can have a grooved structure in a sidewall of PCB jacket 810B and the grooved structure can include a circular cross-sectional profile along a plane of the sidewall of PCB jacket 810B. These groove structured jacket attach points 812A can be used as grab points by robotic arm 134 to securely hold probe card 802 during the transportation of probe card 802 between probe card holder 132 and probe card manipulator 120. In some embodiments, jacket attach points 812A can be replaced with PCB attach points formed in the PCB (not shown), and PCB attach points can be used as grab points by robotic arm 134 to securely hold probe card 302 during transportation of probe card 302 between probe card holder 132 and probe card manipulator 120. Each of rail guides 812B can have a grooved structure in the sidewall of PCB jacket 810B and the grooved structure can have a rectangular cross-sectional profile along the plane of the sidewall of PCB jacket 810B. These grooved structured rail guides 812B can assist probe card 802 to slide onto rails 806E via the pointed end with ease during the insertion of probe card 802 into receptacle holster 304A and the attachment of probe PCB 310A to IC socket 408, similar to the insertion and attachment of probe card 302 discussed above. The grooved structures of jacket attach points 812A can be closer to probe array chip 310C than the grooved structures of rail guides 812B. In some embodiments, side flaps 812C can extend below rail guides 812B and can extend below bottom surface of probe PCB 310A. The inner surfaces of side flaps 812C can be in physical contact with outer surfaces of the sidewalls of probe PCB 310A.

Figure 12:
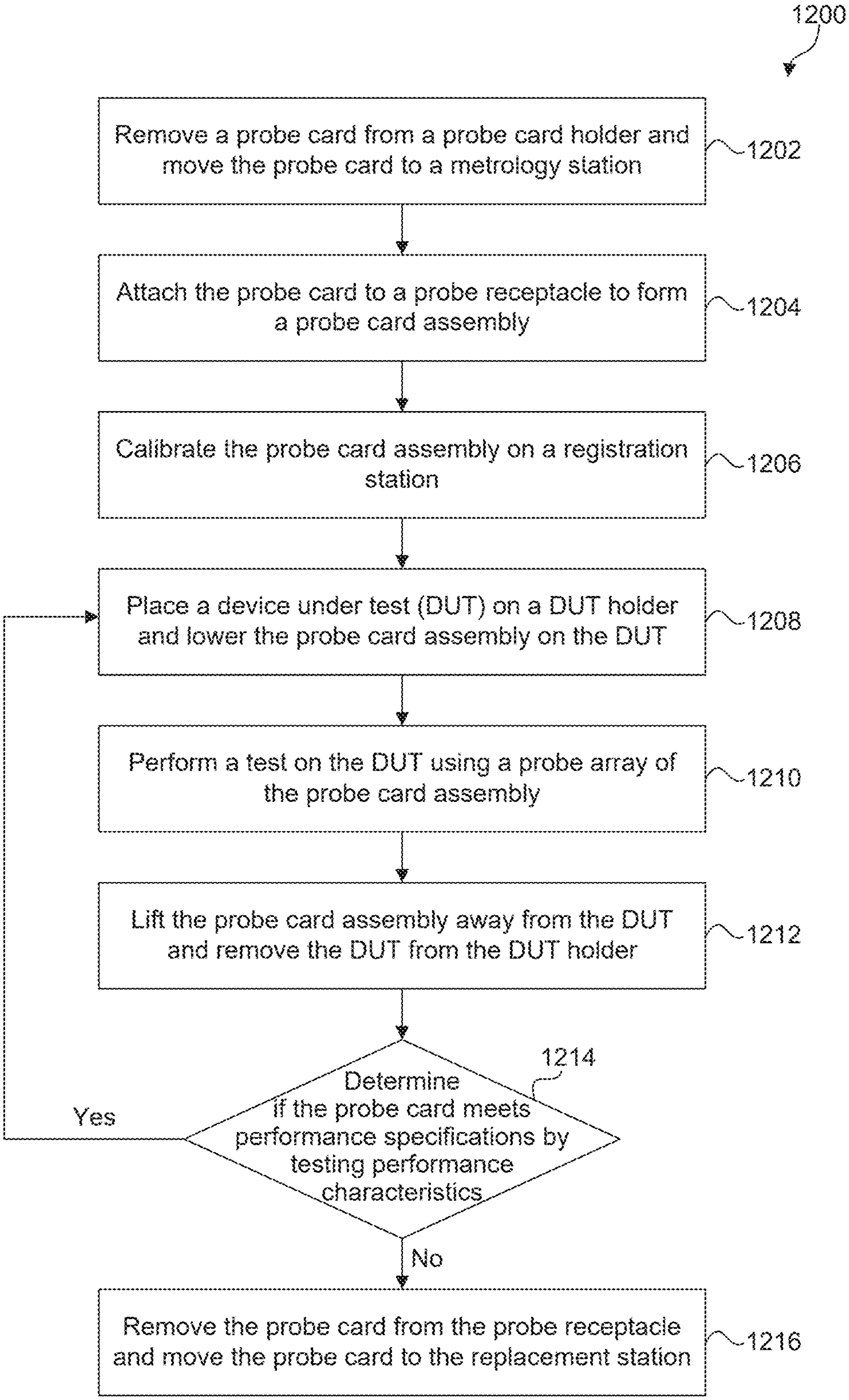
FIG. 12 is a flow diagram of a method for operating a probe card assembly of a test system for DUT testing, in accordance with some embodiments.
Figure 13:
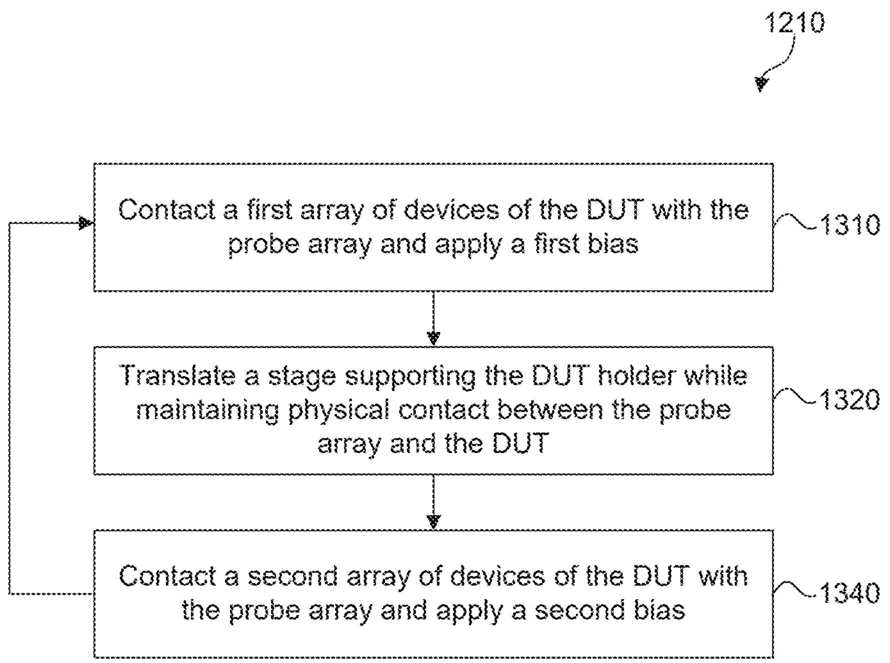
FIG. 13 is a flow diagram of a method for testing a DUT with a probe card assembly of a test system, in accordance with some embodiments.
Figure 14A:
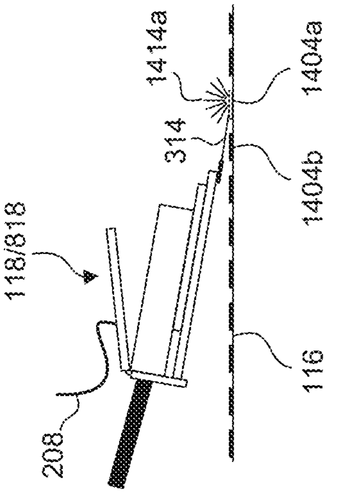
FIG. 14A-14C illustrate various stages of DUT testing with a probe card assembly of a test system, in accordance with some embodiments.
Figure 14B:
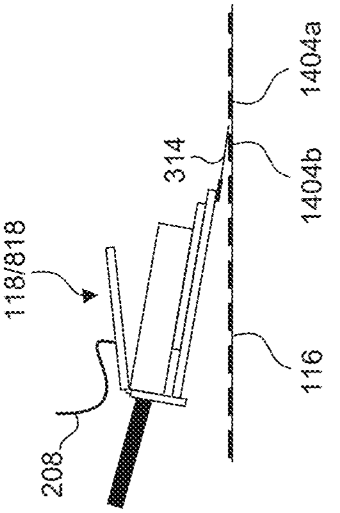
Figure 14C:
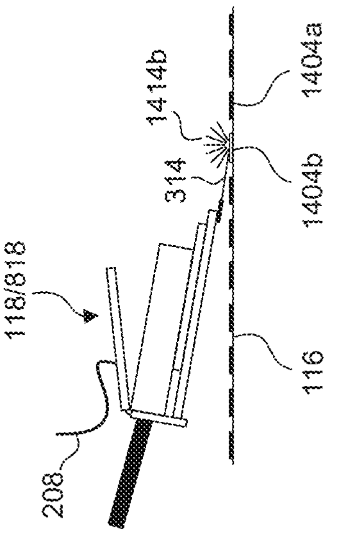

FIG. 12 is a flow diagram of a method 1200 for operating probe card assembly 118 or 818 of test system 100 for testing DUT 116, according to some embodiments. For illustrative purposes, the operations illustrated in FIG. 12 will be described with reference to FIGS. 1-11, 13, and 14A-14C, according to some embodiments. FIG. 13 is a flow diagram of an operation of method 1200, according to some embodiments. FIG. 14A-14C illustrate various stages of testing DUT 116 with probe card assembly 118 or 818 of test system 100, according to some embodiments. Operations of can be performed in a different order, or not performed, depending on specific applications. It should be noted that method 1200 may not result in a complete operation of probe card assembly 118 or 818 in a test cycle of testing DUT 116. Accordingly, it is understood that additional operations can be provided before, during, or after method 1200, and that some of these additional operations may only be briefly described herein. The discussion of elements in FIGS. 1-11 and 14A-14C with the same annotations applies to each other, unless mentioned otherwise.

Referring to FIG. 12, in operation 1202, a probe card is removed from a probe card holder and the probe card is moved to a metrology station. For example, as described with reference to FIGS. 1, 2, 3, 5, 6, 8, 10, and 11, probe card 302 or 802 is removed from probe card holder 132, and is moved to metrology station 110. In some embodiments, removing probe card 302 or 802 from probe card holder 132 and moving to metrology station 110 can include sequential operations of (i) grabbing probe card 302 or 802 at jacket attach points 312A or 812A, respectively, using robotic arm 134 while probe card 302 or 802 stored in probe card holder 132 in replacement station 140, (ii) removing probe card 302 or 802 from probe card holder 132 using robotic arm 134, (iii) transporting probe card 302 or 802 to probe card manipulator 120, (iv) attaching receptacle shaft 306D or 806D of probe card 302 or 802, respectively, to manipulator arm 218 of probe card manipulator 120, and (v) moving probe card 302 or 802 attached to probe card manipulator 120 to metrology station.

Referring to FIG. 12, in operation 1204, the probe card is attached to a probe receptacle to form a probe card assembly. For example, as described with reference to FIGS. 1, 2, 3, 5, 6, 8, 10, and 11, probe card 302 or 802 is attached to probe receptacle 304 or 804, respectively, to form probe card assembly 118 or 818, respectively. The attachment of probe card 302 or 802 to probe receptacle 304 or 804, respectively, can include sequential operations of (i) inserting probe card 302 or 802 to receptacle holster 304A or 804A, respectively, and (ii) attaching probe PCB 310A of probe card 302 or 802 to IC socket 408 of receptacle PCB assembly 304B.

Referring to FIG. 12, in operation 1206, the probe card assembly is calibrated on a registration station. For example, as described with reference to FIGS. 1, 2, 3, 5, 6, 8, 10, and 11, probe card assembly 118 or 818 is calibrated on registration station 174. The calibration of probe card assembly 118 or 818 can include the calibration of probe card 302 or 802 on registration station 174. In some embodiments, calibration of probe card assembly 118 or 818 can include sequential operations of (i) making electrical contact between probe array 314 of probe card assembly 118 or 818 and registration station 174, (ii) applying a bias to probe array 314, (iii) using measurement data from probe array 314 to determine a spatial orientation of probe array 314 relative to registration station 174, and (iv) adjusting the spatial orientation of probe array 314 to match a predetermined spatial orientation. In some embodiments, calibration of probe card assembly 118 or 818 can include sequential operations of (i) making electrical contact between probe array 314 and registration station 174, (ii) applying a bias to probe array 314, (iii) using measurement data from probe array 314 to determine electrical properties (e.g., resistance) of probe array 314 relative to predetermined specifications, and (iv) adjusting a bias delta applied to each individual probe of probe array 314 to compensate for non-uniformities in probe resistance of probe array 314.

Referring to FIG. 12, in operation 1208, a DUT is placed on a DUT holder and the probe card assembly is lowered on the DUT. For example, as described with reference to FIGS. 1, 2, 3, 5, 6, 8, 10, and 11, DUT 116 is placed on DUT holder 114 and probe card assembly 118 or 818 is lowered on DUT 116 using probe card manipulator 120. In some embodiments, DUT 116 can be secured to DUT holder 114 and probe card assembly 118 or 818 can be moved to stage 179 prior to lowering probe card assembly 118 or 818 on DUT 116.

Referring to FIG. 12, in operation 1210, a test is performed on the DUT using a probe array of the probe card assembly. In some embodiments, operation 1210 can include operations 1310-1330, as illustrated in flow diagram of FIG. 13. Referring to FIG. 13, in operation 1310, a first array of devices of the DUT is contacted with the probe array and a first bias is applied to the first array of devices. In some embodiments, multiple bias levels are applied to each array of devices. For example, as described with reference to FIG. 14A, a first array of devices 1404*a* of DUT 116 is contacted with probe array 314 of probe card assembly 118 or 818 and a first bias is applied by SMU 162*a* or SMU 162*b* (shown in FIG. 2, not shown in FIG. 14A). In some embodiments, the same bias can be applied to each probe of probe array 314 and the total current from each DUT 116 can summed. In some embodiments, each probe can be biased independently, and an independent current measurement can be obtained from each individual DUT 116. A first optical signal 1414*a* can be emitted from first array of devices 1404*a* in response to the applied bias and first optical signal 1414*a* can be detected and recorded for analysis.

Referring to FIGS. 13, in operation 1320, the stage supporting the DUT holder and the DUT is translated while maintaining physical contact between the probe array and the DUT. For example, as described with reference to FIG. 14B, DUT holder 114 and DUT 116 are translated relative to probe array 314 while maintaining physical contact between probe array 516 and DUT 116, such that a second array of devices 1404*b* of DUT 116 is aligned with probe array 314. In some embodiments, the translation of DUT holder 114 and DUT 116 relative to probe array 314 can be achieved by applying a translation to underlying stage 179 (shown in FIGS. 1 and 2, not shown in FIG. 4B), while holding probe card assembly 118 or 818 stationary. In some embodiments, the translation of DUT holder 114 and DUT 116 relative to probe array 314 can be achieved by applying a translation to probe card assembly 118 or 818, while holding underlying stage 179 stationary. In some embodiments, the translation of DUT holder 114 and DUT 116 relative to probe array 314 can be achieved by applying a translation to both probe card assembly 118 or 818 and stage 179. Stage 179 can be translated using a physically attached actuation device (not shown), such as direct-drive actuators, stepper motors, brushed and brushless DC motors, DC servo actuators, voice coil actuators, modular piezoelectric actuators, screw piezoelectric actuators, inertia piezoelectric actuators, vacuum-compatible piezoelectric actuators, amplified piezoelectric actuators, or a combination thereof.

Referring to FIG. 13, in operation 1330, the second array of devices is contacted with the probe array and a second bias is applied to the second array of devices. For example, as described with reference to FIG. 14C, second array of devices 1304*b* is contacted with probe array 314 and a second bias is applied by SMU 162*a* or SMU 162*b* (shown in FIG. 2, not shown in FIG. 14C). The first and second bias can be substantially equal to each other. A second optical signal 1414*b* can be emitted from second array of devices 1404*b* in response to the applied bias and second optical signal 1414*b* can be detected and recorded for analysis. In order to maintain a high testing throughput, in some embodiments, the total settling period for each bias applied during operations 1310 and 1330 can be limited to less than about 200 μs. In order to meet the requirements of a system with at least 64 probes (also referred to as "measurement channels") in probe array 314, the range of biases applied can be limited to a range of about −5 V to about +5 V with a maximum current compliance of about 5 mA. In some embodiments an SMU accuracy of about 1 ρV to about 1 pA for the applied bias and the applied current, respectively, and about 100 nV to about 100 fA for the measurements. Other numbers of probes are also possible, and are within the spirit and scope of the disclosed system. Other settling periods, applied biases, current compliances, applied bias and applied current accuracies, and measurement accuracies are also possible, and are within the spirit and scope of the disclosed system.

Referring back to FIG. 12, in operation 1212, the probe card assembly is lifted away from the DUT and the DUT is removed from the DUT holder. For example, as described with reference to FIGS. 1, 2, and 8, probe card assembly 118 or 818 is lifted away from DUT 116 and DUT 116 is removed from DUT holder 114.

Referring to FIG. 12, in operation 1214, a performance characteristic of the probe card is tested to determine if the probe card meets predetermined performance specifications. For example, as described with reference to FIGS. 3, 5, 6, 8, 10, and 11, performance characteristics of probe card 302 or 802 are tested to determine if probe card 302 or 802 meets predetermined performance specifications. In some embodiments, in response to determining that probe card 302 or 802 fails to meet predetermined performance specifications, operation 1216 can be performed after operation 1214. In some embodiments, in response to determining that probe card 302 or 802 meets predetermined performance specifications, operation 1208 can be performed after operation 1214. Performance characteristics can include an electrical resistance, an electrical inductance, or an electrical capacitance of probe array 314. Performance characteristics can be measured on individual probes of probe array 314 and/or an aggregate of individual probes of probe array 314.

Referring to FIG. 12, in operation 1216, the probe card is removed from the probe receptacle and the probe card is moved to the replacement station. For example, as described with reference to FIGS. 1, 2, 3, 5, 6, 8, 10, and 11, probe card 302 or 802 is removed from probe receptacle 304 or 804, respectively, and probe card 302 or 802 is moved to replacement station 140. In some embodiments, removing probe card 302 or 802 from probe receptacle 304 or 804, respectively, and moving to replacement station 174 can include sequential operations of (i) grabbing probe card 302 or 802 at jacket attach points 312A or 812A, respectively, using robotic arm 134 while in probe receptacle 304 or 804, (ii) detaching probe card 302 or 802 from probe receptacle 304 or 804 using robotic arm 134, and (iii) transporting probe card 302 or 802 to probe card holder 132 in replacement station 140. In some embodiments, removing probe card 302 or 802 from probe receptacle 304 or 804, respectively, and moving to replacement station 174 can include sequential operations of (i) grabbing probe card 302 or 802 at PCB attach points using robotic arm 134 while in probe receptacle 304 or 804, (ii) detaching probe card 302 or 802 from probe receptacle 304 or 804 using robotic arm 134, and (iii) transporting probe card 302 or 802 to probe card holder 132 in replacement station 140.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A probe card assembly, comprising:
- a probe card, comprising:
  - a printed circuit board (PCB),
  - a probe array chip disposed on a first end of the PCB, wherein the probe array chip comprises an array of flexible probes, and
  - a PCB jacket disposed on the PCB, the PCB jacket comprising:
    - a grab point on one or more sidewalls of the PCB jacket, and
    - a set of rail guides, wherein each rail guide of the set of rail guides comprises
  - a first curved sidewall; and
- a probe card receptacle, comprising:
  - a receptacle holster comprising a set of rails and configured to hold the probe card, wherein:
    - each rail of the set of rails comprises a second curved sidewall,
    - curvatures of the first and second curved sidewalls are complementary to each other, and
    - the first curved sidewalls are in contact with the second curved sidewalls; and
  - a receptacle PCB assembly attached to a second end of the PCB.

2. The probe card assembly of claim 1, wherein the grab point comprises a grooved structure with a circular cross-sectional profile along the one or more sidewalls of the PCB jacket.

3. The probe card assembly of claim 1, wherein the grab point comprises a conical structure on the one or more sidewalls of the PCB jacket.

4. The probe card assembly of claim 1, wherein the probe array chip is wire-bonded to the PCB having a fan-out configuration.

5. The probe card assembly of claim 1, wherein the PCB jacket further comprises a pair of side flaps that extend below a bottom surface of the PCB and are in contact with sidewalls of the PCB.

6. The probe card assembly of claim 1, wherein each rail of the set of rails further comprises:

a first portion with a cylindrical structure; and a second portion with a conical structure.

7. The probe card assembly of claim 1, wherein the receptacle PCB assembly comprises:

an integrated circuit (IC) socket attached to the PCB;

a first receptacle PCB attached to the IC socket;

a second receptacle PCB attached to the receptacle holster; and a ribbon cable or a flexible PCB comprising a first end attached to the first receptacle PCB and a second end attached to the second receptacle PCB.

8. The probe card assembly of claim 7, wherein the IC socket comprises a zero insertion force (ZIF) socket.

9. The probe card assembly of claim 1, wherein the probe card is detachable from the probe card receptacle.

10. The probe card assembly of claim 1, wherein the array of flexible probes is a one-dimensional array.

11. The probe card assembly of claim 1, wherein the flexible probes comprise silicon nitride.

12. A system, comprising:

a replacement station, comprising:

a probe card holder configured to hold a plurality of probe cards, wherein:

each probe card of the plurality of probe cards comprises a printed circuit board (PCB) jacket, the PCB jacket comprises a set of rail guides, and each rail guide of the set of rail guides comprises a first curved sidewall; and a robotic arm configured to remove a probe card from the plurality of probe cards out of the replacement station;

a metrology station comprising a probe card receptacle configured to hold the probe card removed from the replacement station, wherein the probe card receptacle comprises a set of rails configured to slide into the set of rail guides, wherein:

each rail of the set of rails comprises a second curved sidewall, curvatures of the first and second curved sidewalls are complementary to each other, and the first curved sidewalls are in contact with the second curved sidewalls; and a probe card manipulator configured to transport the probe card from the robotic arm to the metrology station.

13. The system of claim 12, wherein the probe card manipulator is configured to actuate with six degrees of freedom.

14. The system of claim 12, wherein each probe card further comprises grooved structured grab points along sidewalls of each probe card, and wherein the robotic arm is configured to hold each probe card at the grooved structured grab points.

15. The system of claim 12, wherein each probe card further comprises conical-shaped grab points that extend outwards from one or more sidewalls of each probe card, and wherein the robotic arm is configured to hold each probe card at the conical-shaped grab points.

16. The system of claim 12, wherein the robotic arm is configured to slide each probe card into the probe card receptacle.

17. The system of claim 12, further comprising a registration station configured to calibrate each probe card.

18. The system of claim 12, wherein each probe card further comprises:

a PCB attached to the PCB jacket; and a probe array chip disposed on the PCB.

19. The system of claim 12, wherein each probe card further comprises:

a PCB attached to the PCB jacket;

a probe array chip disposed on the PCB; and conical-shaped grab points disposed on the PCB jacket that extend outwards from one or more sidewalls of the PCB jacket.

20. The system of claim 12, wherein the metrology station further comprises a device holder configured to hold a device for testing, and wherein the probe card manipulator is configured to position each probe card to be in contact with a top surface of the device on the device holder.

21. A method, comprising:

forming a probe card assembly comprising attaching a probe card to a probe card receptacle by sliding a pair of rails of the probe card receptacle along a pair of tapered rail guides of the probe card using a robotic arm, wherein:

each rail guide of the pair of tapered rail guides comprises a first curved sidewall, each rail of the pair of rails comprises a second curved sidewall, curvatures of the first and second sidewalls are complementary to each other, and the first curved sidewalls are in contact with the second curved sidewalls;

performing a test on a device using the probe card assembly;

determining if the probe card meets predetermined specifications;

in response to determining that the probe card fails to meet the predetermined specifications, removing the probe card from the probe card receptacle using the robotic arm; and transporting the probe card to a probe card holder using the robotic arm.

22. The method of claim 21, further comprising in response to determining that the probe card meets the predetermined specifications, performing another test on the device using the probe card assembly.

23. The method of claim 21, wherein determining if the probe card meets predetermined specifications further comprises:

measuring a resistance of a probe array; and comparing the measured resistance against a predetermined threshold.

24. The method of claim 21, further comprising removing the probe card from the probe card holder using the robotic arm prior to performing the test on the device.

* * * * *